(12) United States Patent
Liu (10) Patent No.: US 9,633,952 B2
(45) Date of Patent: Apr. 25, 2017

(54) SUBSTRATE STRUCTURE AND METHOD FOR MANUFACTURING SAME

(75) Inventor: Lianjun Liu, Tianjin (CN)

(73) Assignee: MEMSEN ELECTRONICS INC., Tianjin (CN)

( * ) Notice: Subject to any disclaimer, the term of this patent is extended or adjusted under 35 U.S.C. 154(b) by 0 days.

(21) Appl. No.: 14/111,093

(22) PCT Filed: Feb. 23, 2012

(86) PCT No.: PCT/CN2012/071489
§ 371 (c)(1),
(2), (4) Date: Oct. 10, 2013

(87) PCT Pub. No.: WO2012/152104
PCT Pub. Date: Nov. 15, 2012

(65) Prior Publication Data
US 2014/0048910 A1 Feb. 20, 2014

(30) Foreign Application Priority Data
May 11, 2011 (CN) .......................... 2011 1 0121476

(51) Int. Cl.
*H01L 21/764* (2006.01)
*H01L 21/768* (2006.01)
(Continued)

(52) U.S. Cl.
CPC ........ *H01L 23/562* (2013.01); *B81C 1/00182* (2013.01); *B81C 1/00365* (2013.01);
(Continued)

(58) Field of Classification Search
CPC .................... H01L 21/76283; H01L 21/76898
See application file for complete search history.

(56) References Cited

U.S. PATENT DOCUMENTS

2004/0245634 A1 12/2004 Kloster et al.
2005/0025942 A1 2/2005 Kloster et al.
(Continued)

FOREIGN PATENT DOCUMENTS

| CN | 101783314 A | 7/2010 |
|---|---|---|
| CN | 201653605 U | 11/2010 |
| CN | 102226999 A | 10/2011 |

OTHER PUBLICATIONS

International Search Report for International Application No. PCT/CN2012/071489; Date of Mailing: May 31, 2012, with English Translation.

*Primary Examiner* — Raj R Gupta
(74) *Attorney, Agent, or Firm* — Cantor Colburn LLP (57) ABSTRACT

Provided is a substrate structure, including: a first substrate and a second substrate arranged correspondingly. A first surface of the first substrate faces a second surface of the second substrate, wherein the first surface is successively arranged with a conductor interconnection layer and a bonding layer, with the bonding layer connecting the first substrate and the conductor interconnection layer to the second substrate. The substrate structure and a method for manufacturing the same. The second substrate can serve as a support substrate and the first substrate as a substrate for directly manufacturing a device. However, the first substrate is formed by the growth of a crystal without the problem of thickness and stress thereof, thereby avoiding unnecessary stress and further improving the performance of the device formed in the first substrate.

8 Claims, 8 Drawing Sheets

(51) Int. Cl.
*H01L 23/522* (2006.01)
*H01L 23/528* (2006.01)
*H01L 23/00* (2006.01)
*H01L 21/84* (2006.01)
*H01L 21/762* (2006.01)
*H01L 21/30* (2006.01)
*H01L 23/544* (2006.01)
*H01L 25/00* (2006.01)
*B81C 1/00* (2006.01)

(52) U.S. Cl.
CPC ........ *H01L 21/30* (2013.01); *H01L 21/76283* (2013.01); *H01L 21/84* (2013.01); *H01L 23/528* (2013.01); *H01L 23/5226* (2013.01); *H01L 23/544* (2013.01); *H01L 25/50* (2013.01); *B81C 2201/019* (2013.01); *H01L 21/76898* (2013.01); *H01L 2223/54426* (2013.01); *H01L 2924/0002* (2013.01)

(56) References Cited

U.S. PATENT DOCUMENTS

| | | | |
|---|---|---|---|
| 2007/0281438 A1* | 12/2007 | Liu et al. | 438/455 |
| 2009/0160050 A1* | 6/2009 | Miyakawa et al. | 257/737 |
| 2011/0121413 A1* | 5/2011 | Allen et al. | 257/416 |

* cited by examiner

SUBSTRATE STRUCTURE AND METHOD FOR MANUFACTURING SAME

This application is a National Stage application of PCT international application PCT/CN2012/071489, filed on Feb. 23, 2012, which claims the priority of Chinese Patent Application No. 201110121476.7, entitled "SUBSTRATE STRUCTURE AND METHOD FOR MANUFACTURING SAME", filed with the Chinese Patent Office on May 11, 2011, both of which are incorporated herein by reference in their entirety.

FIELD OF THE INVENTION

The present invention relates to the field of semiconductor technology, and particularly to a substrate structure and a method for manufacturing the same.

BACKGROUND OF THE INVENTION

With continuous advancement, integrated circuit technology is widely applied to MEMS (Micro Electromechanical System), power devices, circuit systems and the like. A micro device, a micro system, a power device or the like is manufactured on a substrate made of semiconductor materials, by combining micro mechanical technology or other technologies with the integrated circuit manufacturing process.

Traditionally, the device is manufactured on a monocrystalline silicon substrate and a Silicon On Insulator (SOI) substrate.

For SOI substrate is expensive, and the process for manufacturing the micro mechanical device and the circuit is more complex than the process by the traditional process, which may significantly increase the cost of a product. For monocrystalline silicon substrate, a device is formed mainly by depositing a polycrystalline material and other insulating materials on the monocrystalline silicon substrate and then etching the deposited material. However, due to limitations of polycrystalline material deposition process and the material itself, the deposition thickness of the material is limited, which affects the performance of the device.

Particularly, the problem of the above method for manufacturing a device on the above monocrystalline silicon substrate is that, the polycrystalline material deposited on the substrate has a large stress which affects the realizable deposition thickness of the polycrystalline silicon and the performance of the device, especially for those devices showing high sensitive to stress. For example, a MEMS inertial sensor or a capacitive pressure sensor is operated by a principle that a polycrystalline silicon structure changes in capacitance under inertia or pressure. Thus, when such sensors are manufactured, the stress of the polycrystalline silicon may severely affect the performance of the device.

SUMMARY OF THE INVENTION

The object of the present invention is to provide a substrate structure and a method for manufacturing the same to avoid the stress in a formed device and improve a performance of a function device formed in the substrate.

In order to achieve the above object, a substrate structure is provided according to the invention. The substrate structure includes:

a first substrate and a second substrate oppositely arranged, wherein a first surface of the first substrate faces toward a second surface of the second substrate, and a conductive interconnect layer and a bonding layer are provided on the first surface in sequence; and the first substrate and the conductive interconnect layer are coupled to the second substrate via the bonding layer.

Optionally, the first substrate includes a monocrystalline semiconductor or a monocrystalline compound semiconductor.

Optionally, the conductive interconnect layer includes at least one conductive layer.

Optionally, the bonding layer is an insulating layer or a conductive layer.

Optionally, the bonding layer is a conductive layer, and the conductive layer performs a shielding function.

Optionally, the bonding layer is an insulating layer, and the conductive interconnect layer includes at least two conductive layers.

Optionally, the substrate structure further includes: isolation regions passing through the first substrate, wherein the first substrate is divided into regions mutually insulated by the plurality of isolation regions.

Optionally, the substrate structure further includes: a first cavity located in the second substrate and formed by the second substrate and the bonding layer.

Optionally, the substrate structure further includes: a second cavity located between the first surface and the second surface.

Optionally, the substrate structure further includes: a third cavity formed by communicating the first cavity with the second cavity.

Optionally, an epitaxial layer or doped layer is provided on a lower surface of the first substrate, the epitaxial layer or doped layer is adapted to form a part of a function layer of a device.

Optionally, the substrate structure further includes: a lead-out through hole passing through the first substrate, wherein an outer wall of the lead-out through hole has an insulation layer, and the lead-out through hole is adapted to electrically lead out the conductive interconnect layer.

Correspondingly, a method for manufacturing a substrate structure is provided according to the invention. The method includes:

preparing a first substrate;

forming a conductive interconnect layer and a bonding layer on a first surface of the first substrate in sequence;

preparing a second substrate; and coupling the first substrate and the conductive interconnect layer to a second surface of the second substrate via the bonding layer, so as to fixedly couple the first substrate and the conductive interconnect layer to the second substrate.

Optionally, the step of forming a conductive interconnect layer includes: forming, on the first surface, the conductive interconnect layer including at least one conductive layer.

Optionally, the bonding layer is an insulating layer or a conductive layer.

Optionally, the bonding layer is a conductive layer, and the conductive layer performs a shielding function.

Optionally, the bonding layer is an insulating layer, and the step of forming a conductive interconnect layer includes: forming, on the first surface, a conductive interconnect layer including at least two conductive layers.

Optionally, after coupling the first substrate and the conductive interconnect layer to the second substrate, the method further includes: thinning and polishing the first substrate from a surface opposite to the first surface.

Optionally, the preparing the first substrate further includes: forming isolation regions in the first substrate from the first surface of the first substrate; and after coupling the second substrate, the method further includes: thinning and polishing the first substrate from a surface opposite to the first surface to expose the isolation regions, wherein the isolation regions pass through the first substrate, and the first substrate is divided into regions mutually insulated by the plurality of isolation regions.

Optionally, the preparing the second substrate further includes: forming a first opening in the second substrate from the second surface of the second substrate;

wherein the step of coupling the first substrate and the conductive interconnect layer to a second surface of the second substrate includes: coupling the first substrate and the conductive interconnect layer to the second surface via the bonding layer, wherein a first cavity is formed by the first opening and the bonding layer; and fixedly couple the first substrate and the conductive interconnect layer to the second substrate.

Optionally, after forming a conductive interconnect layer and a bonding layer, the method further includes: etching the bonding layer and the conductive interconnect layer, so as to form a second opening to expose the first surface;

wherein the step of coupling the first substrate and the conductive interconnect layer to a second surface of the second substrate includes: coupling the first substrate and the conductive interconnect layer to the second surface of the second substrate via the bonding layer, wherein a second cavity is formed by the second opening and the second surface; and fixedly couple the first substrate and the conductive interconnect layer to the second substrate;

or, the step of coupling the first substrate and the conductive interconnect layer to a second surface of the second substrate includes: coupling the first substrate and the conductive interconnect layer to the second surface via the bonding layer, wherein a first cavity is formed by the first opening and a second cavity is formed by the second opening; and fixedly couple the first substrate and the conductive interconnect layer to the second substrate.

Optionally, the preparing a first substrate includes: preparing the first substrate, wherein an epitaxial layer or doped layer is formed on the first surface of the first substrate, and the epitaxial layer or doped layer is adapted to form a part of a function layer of a device.

Optionally, the preparing a first substrate includes: forming, in the first substrate, a lead-out through hole having an insulation layer from the first surface; and after coupling the first substrate and the conductive interconnect layer to the second substrate, the method further includes: thinning and polishing the first substrate from a surface opposite to the first surface to expose the lead-out through hole, wherein the lead-out through hole passes through the first substrate, and the lead-out through hole is adapted to electrically lead out the conductive interconnect layer.

Compared with the prior art, the above technical solution has the following advantages.

In the substrate structure and the method for manufacturing the same provided by the embodiment of the present invention, two substrates are prepared, and the first substrate and the conductive interconnect layer are coupled with the second substrate via the bonding layer. In this way, the second substrate may be used as a substrate for providing the support. The first substrate, which is formed by single crystal and therefore no limitations on thickness and stress, may be a substrate for directly manufacturing a device thereon. In this case, unnecessary stress is avoided, and the performance of the device formed in the first substrate is improved.

Furthermore, the conductive interconnect layer or the bonding layer may function as a shielding layer. When the substrate structure is used for manufacturing a device having a special requirement on an electrical signal, in addition to being used as the conductive layer and/or the bonding layer, the substrate structure can also be used as a signal shielding layer to shield undesired electrical signals.

Furthermore, the first substrate may also include the isolation regions, and a plurality of isolation regions divides the first substrate into regions mutually insulated. In this way, the insulated regions of the first substrate are isolated electrically from each other, but the entire substrate structure is still connected mechanically.

Furthermore, a first cavity may also be provided in the second substrate and/or a second cavity may also be provided between the first substrate and the second substrate. The first cavity may be used as a part of the device, and may also be used as an alignment pattern on the second substrate. The second cavity or a combination of the first and second cavities may be used subsequently to form a device or structure which requires a cavity, for example a reference pressure cavity of a pressure sensor.

Furthermore, a lead-out through hole can also be provided in the first substrate, and the lead-out through hole is used to electrically lead out the conductive interconnect layer. That is, the conductive interconnect layer buried under the first surface of the first substrate is lead out onto the opposite upper surface of the first substrate via the lead-out through hole, thus facilitating the subsequent electrical connection of the device. In this case, on the one hand the subsequent manufacturing process is simplified, and on the other hand, the area of the subsequent integrated device is reduced.

BRIEF DESCRIPTION OF THE DRAWINGS

The above and other objects, features and advantages will be more apparent with reference to the accompanying drawings. In the accompanying drawings, the same reference numerals indicate the same parts. The accompany drawings may not be drawn to scale, so as not to unnecessarily obscure the embodiments of the present invention.

DETAILED DESCRIPTION OF THE INVENTION

To make the above object, features and advantages of the present invention more obvious and easy to be understood, in the following, embodiments of the present invention will be illustrated in detail in conjunction with the drawings.

More specific details will be set forth in the following descriptions for sufficient understanding of the disclosure, however the present invention can also be implemented by other ways different from the way described herein, similar extensions can be made by those skilled in the art without departing from the spirit of the present invention, therefore the present invention is not limited to particular embodiments disclosed hereinafter.

In addition, the present invention is described in conjunction with the schematic drawings. When describing the embodiments of the present invention in detail, for ease of illustration, sectional views showing the structure of the device are enlarged partially on the usual scale, and the views are only examples, which should not be understood as limiting the protection scope of the present invention. Furthermore, in an actual manufacture process, three-dimensioned space, i.e. length, width and depth should be considered.

Figure 2:
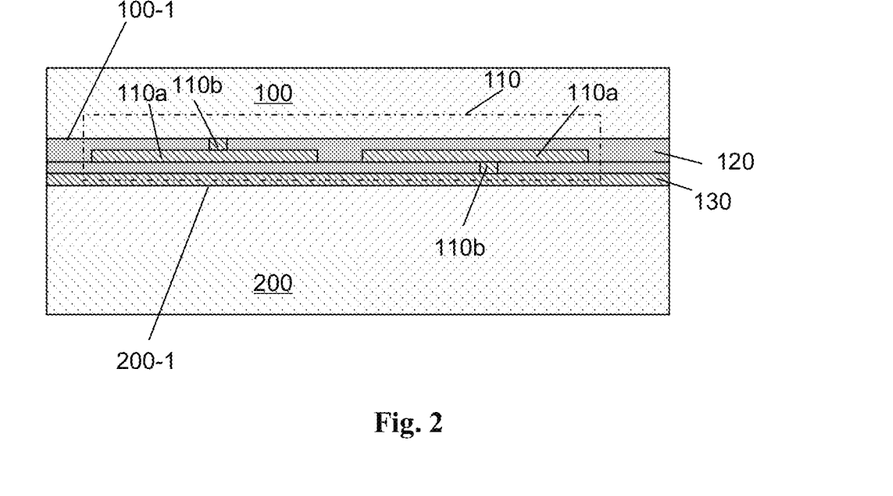

In order to avoid the stress in a process for forming a device, a substrate structure is provided according to the present invention. As shown in FIG. 2, the substrate structure includes a first substrate 100 and a second substrate 200.

The first substrate 100 and the second substrate 200 are oppositely arranged.

A first surface 100-1 of the first substrate 100 faces toward a second surface 200-1 of the second substrate 200, and a conductive interconnect layer 110 and a bonding layer 130 are provided on the first surface 100-1 in sequence.

The bonding layer 130 couples the first substrate 100 and the conductive interconnect layer 110 to the second substrate 200.

In the invention, the conductive interconnect layer 110 includes at least one conductive layer 110a, and the conductive layer may be of a single layer structure or a laminated multilayer structure.

In the invention, the conductive interconnect layer 110 may also include a conductive through hole 110b. The electrical connections between the conductive layers 110a and/or between the conductive layer 110a and the first substrate 110 may be implemented via the conductive through hole 110b. Both the conductive layer 110a and the conductive through hole 110b may be made of a metal, a doped semiconductor material or other appropriate conductive materials, such as Al, Cu, AlSi, Ti, W or polycrystalline silicon.

In the invention, the conductive interconnect layer 110 may be located in an inter-conductor dielectric layer 120.

In the invention, the bonding layer 130 is an insulating layer or a conductive layer, which functions as a bonding connection. The bonding layer is adapted to couple the first substrate and the conductive interconnect layer with the second substrate. The bonding layer may be made of polycrystalline silicon, polycrystalline silicon germanium (SiGe), aluminium (Al), copper (Cu), silicon oxide, silicon oxynitride, amorphous silicon or other appropriate materials.

In the invention, the first substrate 100 may be made of a monocrystalline semiconductor; a monocrystalline compound semiconductor; or other appropriate materials, such as monocrystalline silicon, monocrystalline germanium, monocrystalline germanium silicon or other monocrystalline materials. Preferably, the first substrate may be made of monocrystalline silicon, and may be used to form the required device and circuit thereon. The second substrate 200 may be made of monocrystalline, polycrystalline or amorphous semiconductor material; or other appropriate materials, such as monocrystalline silicon, polycrystalline silicon, quartz, or glass. The second substrate 200 may also be a laminated layer made of different materials, such as a monocrystalline or polycrystalline silicon laminated layer having an oxide layer or other material layer on the surface thereof. The second substrate may functions as a mechanical support or others. For the materials and the applications of the first and second substrates, it is only an example herein, and the invention will not be limited to this.

In the invention, the first substrate and the conductive interconnect layer is coupled to the second substrate via the bonding layer to form the substrate structure. In this way, the second substrate may be used as a supporting substrate, and the first substrate may be used as a substrate for directly manufacturing a device thereon. In addition, the first substrate is formed by crystal growth, and therefore there are no problems on the thickness and stress. In this way, the unnecessary stress is avoided in the substrate, thus improving the performance of the device formed on the first substrate.

Based on the above mentioned idea, a specific embodiment will be described in detail below.

First Embodiment

Figure 1:
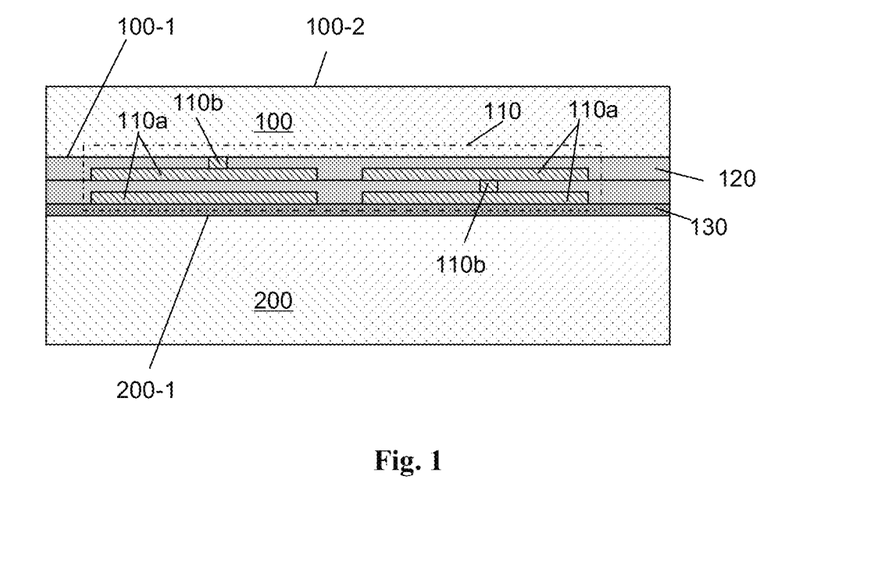
FIGS. 1 and 2 are respectively structural schematic diagrams of a substrate structure according to a first embodiment.

FIGS. 1 and 2 are embodiments of the substrate structure according to the invention, where the bonding layers are an insulating layer and a conductive layer respectively. As shown in the Figures, the substrate structure includes: a first substrate 100 and a second substrate 200.

The first substrate 100 and the second substrate 200 are oppositely arranged.

A first surface 100-1 of the first substrate 100 faces toward a second surface 200-1 of the second substrate 200, and a conductive interconnect layer 110 and a bonding layer 130 are provided on the first surface 100-1 in sequence.

The bonding layer 130 couples the first substrate 100 and the conductive interconnect layer 110 to the second substrate 200.

Specifically, as shown in the FIG. 1, the bonding layer 130 may be an insulating layer, which may be made of non-conductive material, such as silicon oxide, silicon oxynitride, undoped amorphous silicon or other appropriate materials. In an embodiment where the bonding layer 130 is the insulating layer, the conductive interconnect layer 110 includes at least one conductive layer 110a, which may be used as an electrode or an electrical connection wire. Preferably, when a device having a special requirement on an electrical signal is manufactured, the conductive interconnect layer 110 may include at least two conductive layers 110a, in which a first conductive layer (which is close to the first substrate) may be used as an electrode or an electrical connection wire, and a second conductive layer (which is close to the second substrate) may perform a shielding function to shield undesired electrical signals. The bonding layer 130 is adapted to fixedly couple the first substrate 100 and the conductive interconnect layer 110 with the second substrate 200.

Specifically, as shown in the FIG. 2, the bonding layer 130 may be a conductive layer. In an embodiment where the bonding layer 130 is a conductive layer, the conductive interconnect layer 110 includes at least one conductive layer 110a, and the bonding layer 130 is electrically connected with the conductive layer 110a via a conductive through hole 110b. The bonding layer 130 performs both conductive layer and a bonding layer function, so as to couple the first substrate 100 to the second substrate. The bonding layer 130 may be made of a doped semiconductor material; a metal material; or other appropriate conductive materials, such as polycrystalline silicon, polycrystalline germanium silicon, amorphous silicon, aluminium (Al) or copper (Cu), or other appropriate materials. Preferably, when the substrate structure is used to manufacture a device having a special requirement on an electrical signal, in addition to being used as a conductive layer and a bonding layer, the bonding layer 130 which is a conductive layer may also function as a shielding layer for shielding undesired electrical signals.

In this embodiment, the conductive interconnect layer 110 is formed in an inter-conductor dielectric layer 120.

In this embodiment, the conductor layer 110a also includes a conductive through hole 110b, and an electrical connection may be implemented between the conductive layers 110a and/or between the conductive layer 110a and the first substrate 110 via the conductive through hole 110b. The conductive layer 110a and the conductive through hole 110b may be made of a metal; a doped semiconductor material; or other appropriate conductive materials, such as Al, Cu, AlSi, Ti, W or polycrystalline silicon.

In this embodiment, the first substrate 100 is made of monocrystalline silicon, and the second substrate 200 is made of monocrystalline silicon or polycrystalline silicon. In other embodiments, the first substrate 100 may also be made of other monocrystalline semiconductors, monocrystalline compound semiconductors or other appropriate materials, which is adapted to form the required device and circuit thereon. In other embodiments, the second substrate 200 may also be made of other monocrystalline, polycrystalline or amorphous semiconductor materials; or other appropriate materials, such as monocrystalline silicon, glass, and quartz, and the second substrate may functions as a mechanical support or others. The second substrate 200 may also be a laminated multiple layers made of different materials, such as a monocrystalline or polycrystalline silicon laminated layer having an oxide layer or other material layer on the surface thereof. It is only an example herein, and the invention will not be limited to this.

In this embodiment, the first substrate 100 with the conductive interconnect layer 110 is coupled to the second substrate 200 via the bonding layer 130 which is an insulation layer or a conductive layer. The second substrate may be used as a supporting substrate, and the first substrate may be used as a substrate for directly manufacturing a device thereon. In addition, the first substrate is formed by crystal growth, and therefore there are no limitations of thickness and stress. In this way, the unnecessary stress is avoided, thus improving the performance of the device formed in the first substrate. Furthermore, in a preferable embodiment, the conductive interconnect layer or the bonding layer has a shielding function to shield undesired electrical signals.

Figure 3:
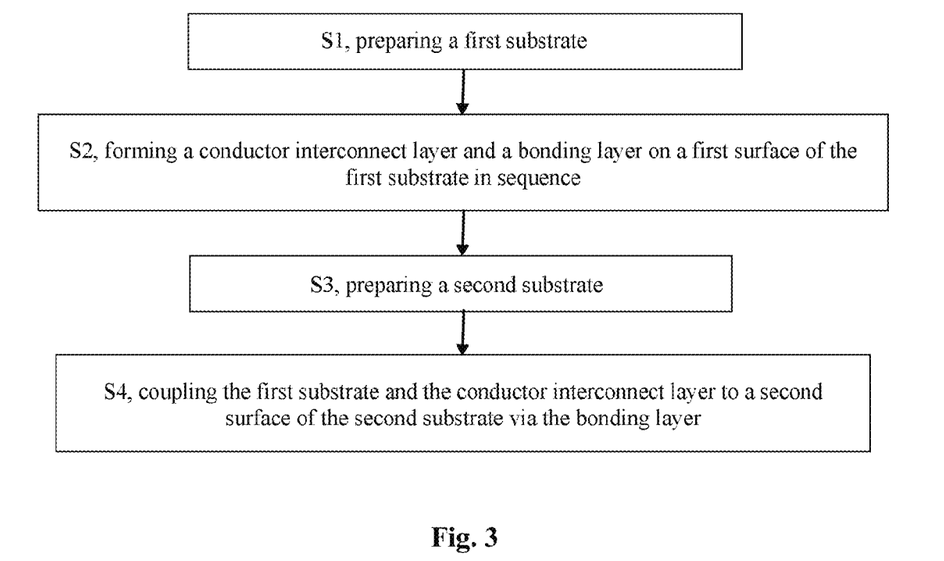
FIG. 3 is a flowchart of a method for manufacturing the substrate structure according to the first embodiment.
Figure 4:
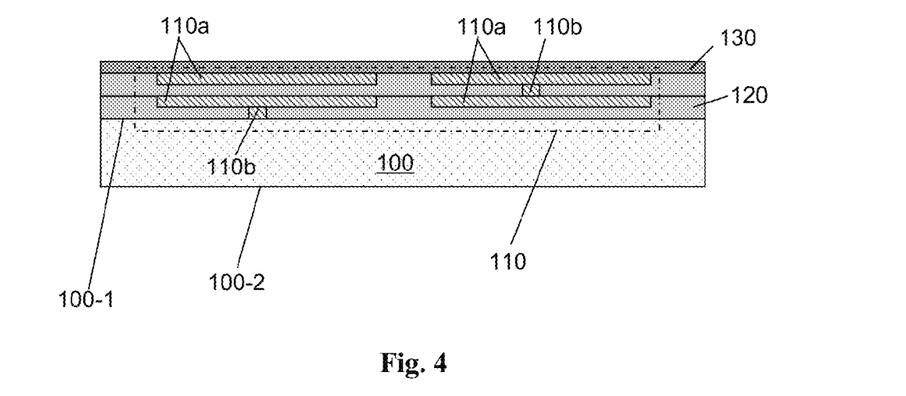
FIGS. 4 to 6 are respectively structural schematic diagrams of various manufacturing stages of the substrate structure according to the first embodiment.
Figure 5:
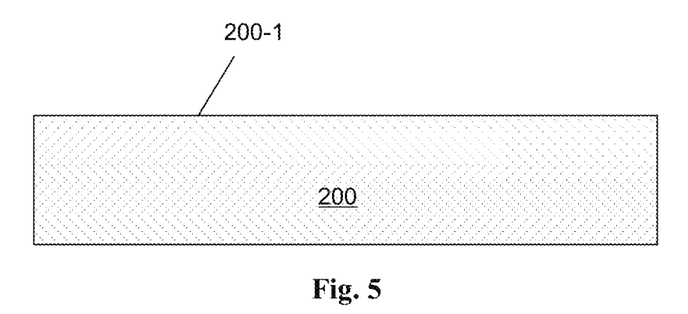
Figure 6:
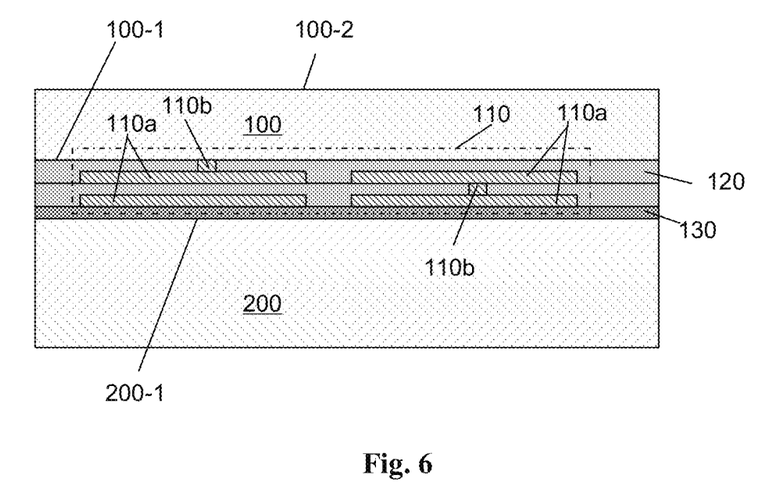

In the following, a method for manufacturing the above mentioned substrate structure will be illustrated in detail in conjunction with the drawings. FIG. 3 is a flowchart of a method for manufacturing the substrate structure in the embodiment of the invention, FIGS. 4 to 6 are schematic diagrams of a method for manufacturing the substrate structure. As shown in the Figures, the manufacturing method includes steps S11 to S14.

In step S11, a first substrate 100 is prepared.

Referring to FIG. 4, the first substrate 100 has a first surface 100-1 and a surface 100-2 opposite to the first surface 100-1. In this embodiment, the first substrate is a monocrystalline silicon substrate. In other embodiments, the first substrate may also be a substrate made of other monocrystalline semiconductors, monocrystalline compound semiconductors or other appropriate materials.

In step S12, referring to FIG. 4, a conductive interconnect layer 110 and a bonding layer 130 are formed in sequence on the first surface 100-1 of the first substrate 100.

Particularly, an inter-conductor dielectric layer 120 is formed on the first surface 100-1 and a conductive interconnect layer 110 is formed in the inter-conductor dielectric layer 120 in a traditional interconnection process or Dual Damascene interconnection process. The conductive interconnect layer 110 includes at least one conductive layer 110a, and also includes a conductive through hole 110b. An electrical connection may be implemented between the conductive layers 110a and/or between the conductive layer 110a and the first substrate 110 via the conductive through hole 110b.

Next, a bonding layer 130 is formed on the conductive interconnect layer 110.

In an embodiment where the bonding layer 130 is a polycrystalline silicon layer, the bonding layer 130 is electrically coupled with the conductive interconnect layer 110 in the above mentioned interconnection process. Preferably, the bonding layer 130 has a shielding function, which may be a shielding function layer. The bonding layer 130 may be made of polycrystalline silicon, polycrystalline germanium silicon, amorphous silicon, aluminium (Al), copper (Cu) or the like.

In an embodiment where the bonding layer 130 is an insulating layer, the bonding layer may be formed on the conductive interconnect layer 110 in the processes of deposition and planarization. The bonding layer may be made of a dielectric material, such as silicon oxide, silicon oxynitride, and amorphous silicon. Preferably, the conductive interconnect layer 110 includes at least two conductive layers 110a.

The conductive interconnect layer 110, the conductive layers 110a and the conductive through hole 110b may be made of a metal or a doped semiconductor material, or other appropriate conductive materials, such as Al, Cu, and polycrystalline silicon.

In step S13, a second substrate 200 is prepared.

Referring to FIG. 5, the second substrate 200 has a second surface 200-1 and a surface opposite to the second surface 200-1. In this embodiment, the second substrate 200 is made of monocrystalline or polycrystalline silicon. In other embodiments, the second substrate may also be made of other monocrystalline, polycrystalline or amorphous semiconductor materials; or other appropriate materials, such as glass and quartz. The second substrate 200 may also be a laminated layer made of different materials.

In step S14, the first substrate 100 and the conductive interconnect layer 110 are coupled to the second surface 200-1 of the second substrate 200 via the bonding layer 130, so as to fixedly couple the first substrate 100 and the conductive interconnect layer 110 to the second substrate 200, as shown in FIG. 6.

Specifically, firstly, the first substrate 100, on the first surface of which the conductive interconnect layer 100 and the bonding layer 130 are provided, is arranged oppositely to the second surface 200-1 of the second substrate 200, so that the bonding layer 130 is in contact with the second surface 200-1. Then, a pressure is applied against the first and second substrates 100 and 200, so that the bonding layer 130 is bonded with the second substrate 200, and the first substrate 100 and the conductive interconnect layer 110 is fixedly coupled to the second substrate 200. For example, the bonding layer is made of polycrystalline silicon. It is only an example herein, the invention will not be limited to this, and the steps of the bonding connection may be different due to different materials of the bonding layer 130.

Preferably, after bonded with the second substrate 200, the first substrate may also further be thinned and polished from a back surface 100-2 to achieve a required thickness of the first substrate 100.

By now, the substrate structure provided by this embodiment has been manufactured completely. The conductive interconnect layer 110 is formed between the first substrate 100 and the second substrate 200. A device, a circuit or other structures, such as MEMS or a power device/circuit, may be formed on the first substrate and/or the second substrate according to a design requirement of a device. Since the first substrate and/or the second substrate may be a substrate formed by crystal growth, there are no limitations of thickness and stress, and the unnecessary stress in the substrate is avoided.

The substrate structure and the method for manufacturing the same, in which the first substrate and the conductive interconnect layer are coupled with the second substrate via the bonding layer, are described in detail above. Furthermore, based on this substrate structure, this substrate structure may further include other structures, such as an isolation region in the first substrate, a first cavity in the second substrate, a second cavity between the first substrate and the second substrate, a doped layer or epitaxial layer on the first surface of the first substrate, a lead-out through hole in the first substrate, or any combination thereof. In the following, these substrate structures will be described in detail according to particular embodiments.

Second Embodiment

In the following, only differences of the second embodiment from the first embodiment will be set forth. A part that is not described should be considered to be performed by using the same steps, method or process as that of the first embodiment, which will not be described in detail herein.

Figure 7:
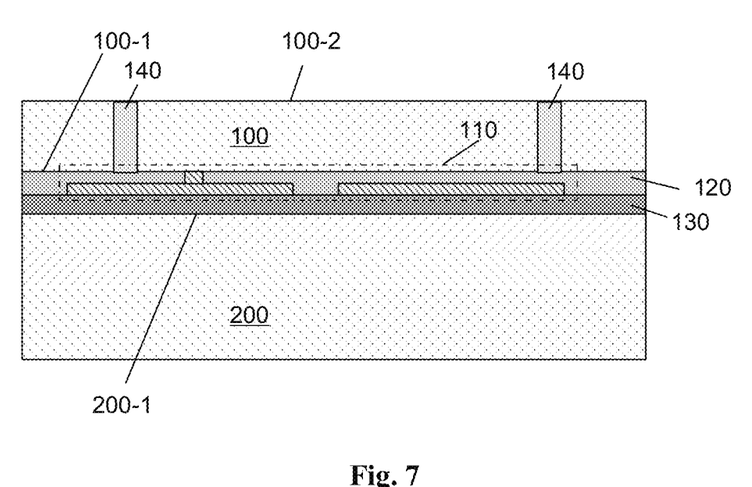
FIGS. 7 and 8 are respectively structural schematic diagrams of a substrate structure according to a second embodiment.
Figure 8:
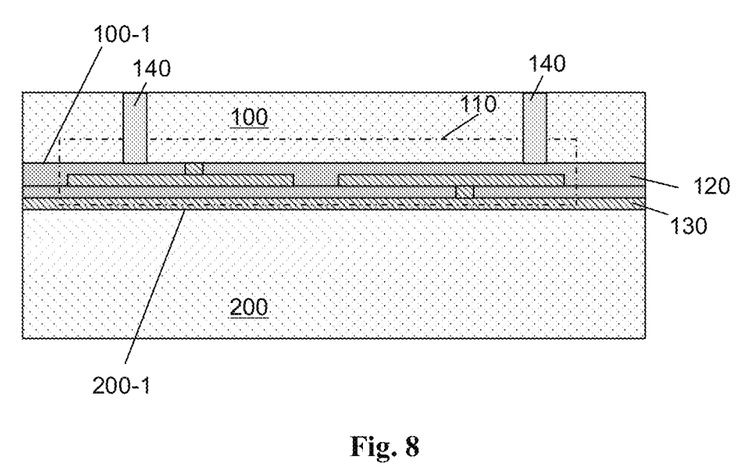

Referring to FIGS. 7 and 8, FIGS. 7 and 8 are embodiments in which the bonding layers are an insulating layer and a conductive layer respectively. Based on the substrate structure of the first embodiment, isolation regions passing through the first substrate may be included. As shown in the Figures, the substrate structure includes:

a first substrate 100 and a second substrate 200 oppositely arranged; and isolation regions 140 passing through the first substrate 100, by which the first substrate 100 is divided into regions mutually insulated by the multiple isolation regions 140, where a first surface 100-1 of the first substrate 100 faces toward a second surface 200-1 of the second substrate 200, and a conductive interconnect layer 110 and a bonding layer 130 are provided on the first surface 100-1 in sequence; and the first substrate 100 and the conductive interconnect layer 110 are coupled to the second substrate 200 via the bonding layer 130.

The first substrate 100 is divided into some regions mutually insulated by the multiple isolation regions 140.

Compared with the first embodiment, the difference is that the substrate structure further includes the isolation regions 140 with an insulating material, by which the first substrate 100 is divided into multiple regions mutually insulated. In this way, the regions of the first substrate are isolated electrically but still connected mechanically. The parts of the second embodiment that are the same as that of the first embodiment will not be described in detail.

For the manufacturing method in the second embodiment, referring to FIGS. 7 to 8. The manufacturing method includes the steps S21 to S25.

S21: preparing a first substrate 100, and forming isolation regions 140 in the first substrate 100 from a first surface 100-1 of the first substrate 100.

An opening is etched in the first substrate from the first surface 100-1 in a traditional process for forming the isolation in the semiconductor processes. Next, the isolation region 140 is formed by depositing an insulating material and performing the planarization (not shown in the Figures). The depth of the isolation region 140 may be determined based on the thickness of the first substrate 100 in the finally formed substrate structure, and may be equal to or greater than the thickness of the first substrate 100 in the final structure.

S22: forming a conductive interconnect layer 110 and a bonding layer 130 on the first surface 100-1 of the first substrate 100 in sequence.

S23: preparing a second substrate 200.

S24: coupling the first substrate 100 and the conductive interconnect layer 110 to the second surface 200-1 of the second substrate 200 via the bonding layer 130, so as to fixedly couple the first substrate 100 and the conductive interconnect layer 110 to the second substrate 200.

S25: thinning and polishing the first substrate 100 from a surface 100-2 opposite to the first surface 100-1 to expose the isolation region 140. In this way, the isolation region 140 passing through the first substrate is formed. The multiple isolation regions 140 divides the first substrate 100 into regions mutually insulated.

The difference between the manufacturing method in the first embodiment and that in the second embodiment comprises the steps S21 and S25, and the other same parts that are the same will not be described in detail. By forming the isolation region 140, the first substrate 100 is divided into regions mutually insulated. Thus, required devices may be manufactured in the mutually insulated regions of the substrate in the process of manufacturing the device subsequently.

Third Embodiment

In the following, only differences of the third embodiment from the first embodiment will be set forth. A part that is not described should be considered to be performed by using the same steps, method or process as that of the first embodiment, which will not be described in detail herein.

Figure 9:
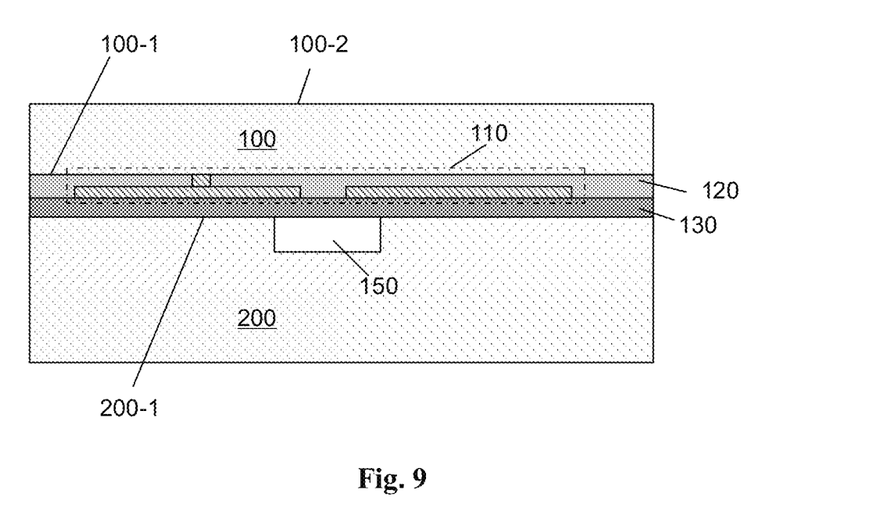
FIGS. 9 and 10 are respectively structural schematic diagrams of a substrate structure according to a third embodiment.
Figure 10:
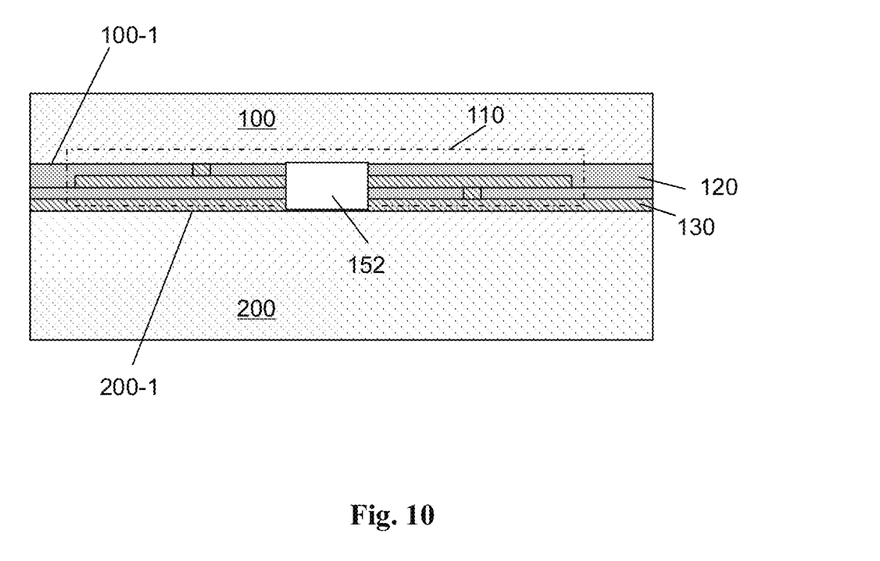

FIGS. 9 and 10 are embodiments in which the bonding layers are an insulating layer and a conductive layer respectively. Based on the substrate structure of the first or second embodiment, a first cavity 150 in a second substrate or a second cavity 152 between a first surface 100-1 and a second surface 200-1 may further be included, or a combination of the first cavity 150 and the second cavity 152 may further be included.

As shown in FIG. 9, in some embodiments, the substrate structure includes:

a first substrate 100 and a second substrate 200 oppositely arranged, where a first surface 100-1 of the first substrate 100 faces toward a second surface 200-1 of the second substrate 200, and a conductive interconnect layer 110 and a bonding layer 130 are provided on the first surface 100-1 in sequence; and a first cavity 150 located in the second substrate 200 and formed by the second substrate 200 and the bonding layer 130, where the first substrate 100 and the conductive interconnect layer 110 are coupled to the second substrate 200 via the bonding layer 130.

Specifically, the first cavity may be a part of a device, such as a reference pressure cavity for a pressure sensor. The first cavity may also be an alignment pattern on the second substrate, which may be used as an alignment structure of the second substrate relative to the first substrate when the first substrate is coupled to the second substrate via the bonding layer.

As shown in the FIG. 10, in another embodiments, the substrate structure includes:

a first substrate 100 and a second substrate 200 oppositely arranged, where a first surface 100-1 of the first substrate 100 faces toward a second surface 200-1 of the second substrate 200, and a conductive interconnect layer 110 and a bonding layer 130 are provided on the first surface 100-1 in sequence; and a second cavity 152 located between the first surface 100-1 and the second surface 200-1;

where the first substrate 100 and the conductive interconnect layer 110 are coupled to the second substrate 200 via the bonding layer 130.

The second cavity is adapted to form subsequently a device or a structure requiring a cavity, such as a reference pressure cavity for a pressure sensor, or others. It is only an example herein, and the invention will not be limited to herein.

Furthermore, in other embodiments (not shown in the Figures), the substrate structure may include both the first cavity and the second cavity described above. Specifically, the substrate structure includes:

a first substrate and a second substrate oppositely arranged, where a first surface of the first substrate faces toward a second surface of the second substrate, and a conductive interconnect layer and a bonding layer are provided on the first surface in sequence;

a first cavity located in the second substrate and formed by the second substrate and the bonding layer, and a second cavity located between the first surface and the second surface; and coupling the first substrate and the conductive interconnect layer to the second substrate via the bonding layer.

Figure 13:
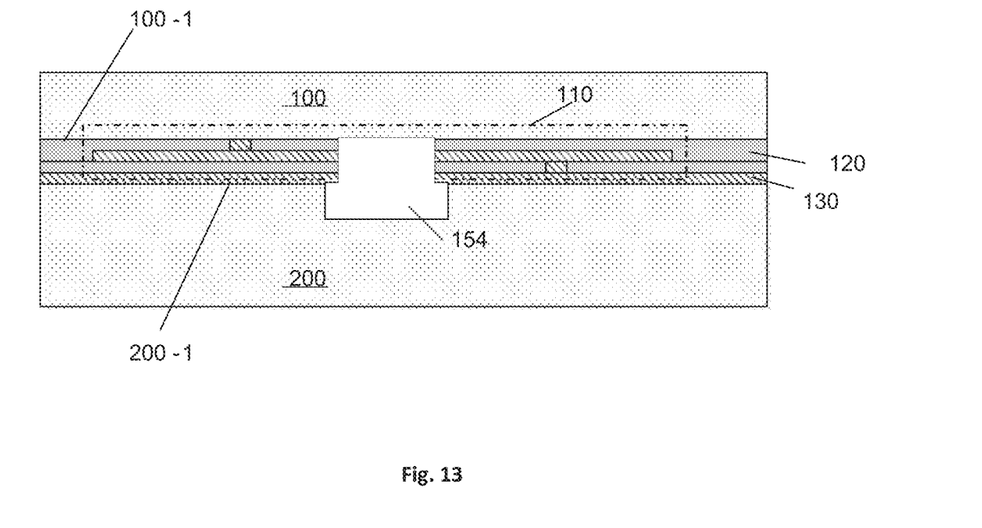
FIGS. 13, 14, and 15 are respectively structural schematic diagram of a substrate structure according to an embodiment.

Furthermore, the first cavity may be opposed to the second cavity, and the first cavity is communicated with the second cavity to form a third cavity (154 in FIG. 13) which is a deeper or larger cavity. The third cavity may be used to form subsequently a device or structure requiring a large cavity, or others.

Optionally, the substrate structure may also further include an isolation region 140 in the first substrate 100 (not shown in the Figures, referring to the Figures for the above mentioned embodiments).

Compared with the first embodiment or the second embodiment, the difference is that the substrate structure further includes the first cavity 150 and/or the second cavity 152. The same parts as that of the first or second embodiment will not be described in detail. The first cavity may be a part of device, and may also be an alignment pattern on the second substrate, which may be an alignment structure of the second substrate relative to the first substrate when the first substrate is coupled to the second substrate via the bonding layer. The second cavities or the combination of the first and second cavities may be used to form subsequently a device or structure requiring a cavity, such as a reference pressure cavity for a pressure sensor.

The difference between the manufacturing method of the third embodiment and that of the first embodiment or the second embodiment is described as followings.

Figure 14:
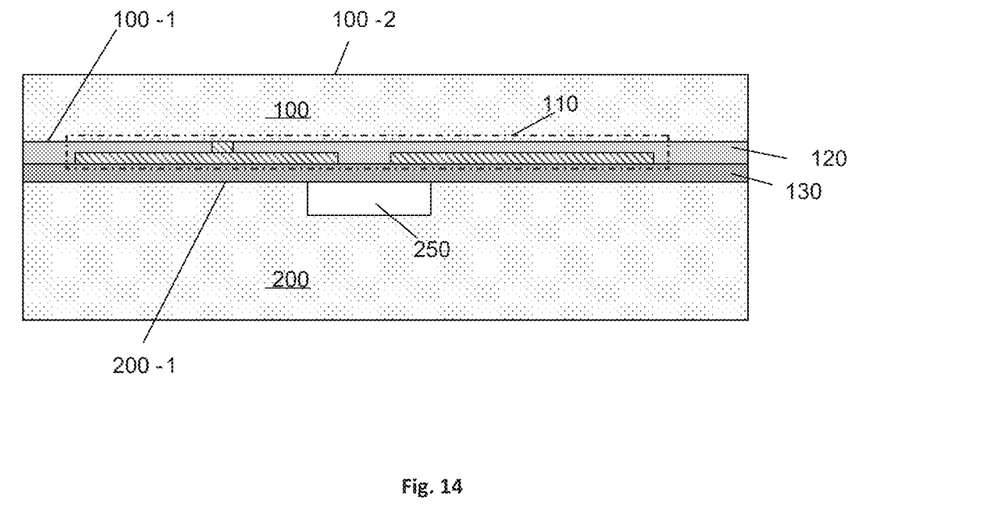

In some embodiments, the difference is the step of preparing a second substrate 200. Specifically, the step of preparing the second substrate includes: preparing the second substrate 200, and forming a first opening (250 in FIG. 14) in the second substrate 200 from a second surface 200-1 of the second substrate 200. The step of coupling the second substrate includes: coupling a first substrate 100 and a conductive interconnect layer 110 to a second surface 200-1 of the second substrate via a bonding layer 130, so as to fixedly couple the first substrate 100 and the conductive interconnect layer 110 to the second substrate 200 and form a first cavity 150 by the first opening and the bonding layer.

According to a design requirement of a device, the first cavity 150 may be aligned to the conductive interconnect layer on the first substrate or other structures in the first substrate.

Figure 15:
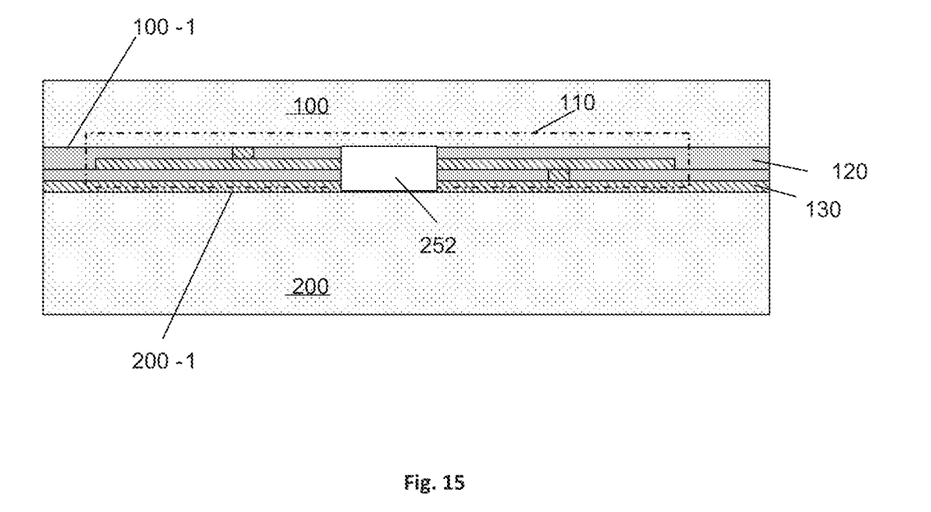

In other embodiments, the difference is the step of forming a conductive interconnect layer and a bonding layer. Specifically, the step of forming a conductive interconnect layer and a bonding layer includes: forming the conductive interconnect layer 110 and the bonding layer 130; and then etching the bonding layer 130 and the conductive interconnect layer 120 to form a second opening (252 in FIG. 15) to expose a first surface 110-1. The step of coupling the second substrate includes: coupling the first substrate 100 and the conductive interconnect layer 110 to a second surface 200-1 of the second substrate 200 via the bonding layer 130, so as to fixedly couple the first substrate 100 and the conductive interconnect layer 110 to the second substrate 200 and form a second cavity 152 by a second opening and the second surface 200-1.

The second cavity may be used to form subsequently a device or structure requiring a cavity such as a reference pressure cavity for a pressure sensor, or others.

In yet other embodiments, the difference is the steps of preparing a second substrate and forming a conductive interconnect layer and a bonding layer. Particularly, the step of forming the conductive interconnect layer and the bonding layer includes: forming the conductive interconnect layer 110 and the bonding layer 130; and then etching the bonding layer 130 and the conductive interconnect layer 120 to form a second opening to expose a first surface 110-1. The step of preparing the second substrate includes: providing the second substrate 200, and forming a first opening inside the second substrate 200 from a second surface 200-1 of the second substrate 200. The step of coupling the second substrate includes: coupling the first substrate 100 and the conductive interconnect layer 110 to the second surface 200-1 via the bonding layer 130, so as to form a first cavity 150 by the first opening, forms a second cavity 152 by the second opening, and fixed couple the first substrate and the conductive interconnect layer to the second substrate.

According to a design requirement of a device, the first cavity 150 may be aligned to the second cavity 152, the conductive interconnect layer 110 on the first substrate or other structures in the first substrate 100.

In an embodiment where the first cavity is aligned to the second cavity, the first cavity 150 is communicated with the second cavity 152 to form a third cavity which is a deeper or larger cavity. The third cavity may be used to form subsequently a device or structure requiring a large cavity, or others.

Compared with the manufacturing method in the first or second embodiment, the difference comprises that the first cavity 150 and/or the second cavity 152 is further formed. The same parts as those of first embodiment and/or second embodiment will not be described in detail. The first cavity may be used as a part of device, which may also be an alignment structure for manufacturing the device subsequently. The second cavities or the combination of the first and second cavities may be used to form subsequently a device or structure requiring a cavity, such as a reference pressure cavity for a pressure sensor.

Fourth Embodiment

In the following, only the differences of the fourth embodiment from the first embodiment will be set forth. A part that is not described should be considered to be performed by using the same steps, method or process as that of the first embodiment, which will not be described in detail herein.

Figure 11:
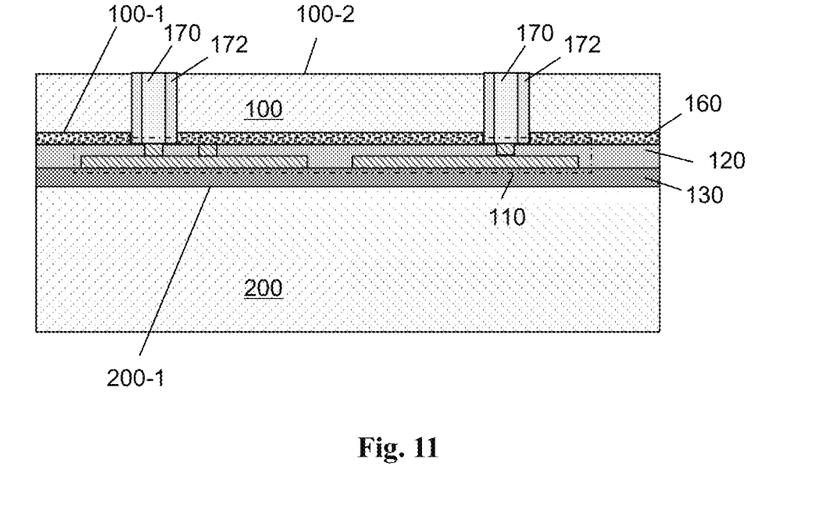
FIGS. 11 and 12 are respectively structural schematic diagrams of a substrate structure according to a fourth embodiment.
Figure 12:
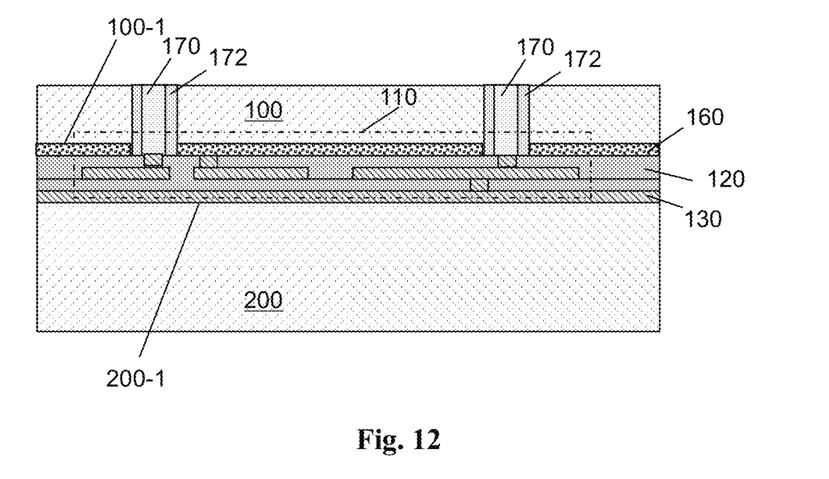

FIGS. 11 and 12 are embodiments in which the bonding layers are an insulating layer and a conductive layer respectively. Based on the first, second, or third embodiment, a doped layer or epitaxial layer 160 may further be included. Specifically, as shown in the Figures, the substrate structure includes:

a first substrate 100 and a second substrate 200 oppositely arranged, where a doped layer or epitaxial layer 160 is provided on a first surface 100-1 of the first substrate 100;

where the first surface 100-1 of the first substrate 100 faces toward a second surface 200-1 of the second substrate 200, and a conductive interconnect layer 110 and a bonding layer 130 are provided on the first surface 100-1 in sequence; and the first substrate 100 and the conductive interconnect layer 110 are coupled to the second substrate 200 via the bonding layer 130.

The doped layer or epitaxial layer 160 is adapted to form a part of function layer of the device, such as a buried gate or a connecting wire, or others, which is only an example herein.

Alternatively, based on the first, second, or third embodiment, the substrate structure further includes a lead-out through hole 170, by which the conductive interconnect layer may be led out onto a second surface 100-2 of the first substrate, that is, the conductive interconnect layer buried under the first substrate is led out onto a second surface 100-2 of the first substrate. In this way, the subsequent electrical connection of the device is facilitated, thus simplifying the subsequent manufacturing process, and saving area of the integrated device.

Alternatively, in some embodiments, as shown in the FIGS. 11 and 12, the substrate structure further includes a lead-out through hole 170 passing through the first substrate 110. According to a particular design requirement, the lead-out through hole 170 may be adapted to couple the conductive interconnect layer 110 which interconnects the doped layer or epitaxial layer 160 as a part of a device onto a second surface 100-2 of the first substrate for subsequent electrical connection.

An outer wall of the above mentioned lead-out through hole 170 may have an insulation layer 172.

The lead-out through hole 170 may be adapted to electrically lead out the conductive interconnect layer 110. In this way, it is easy to provide the further electrical connection for the conductive interconnect layer, or lead the conductive interconnect layer 110 toward a wire bonding pad for packaging, or other functions.

Furthermore, optionally, the substrate structure in the embodiment may also further include: an isolation region 140 in the first substrate 100, a first cavity 150 in the second substrate, or a second cavity 152 between the first surface and the second surface, or any combination of them (not shown in the Figures, referring to the Figures of the above mentioned embodiments).

The difference between this embodiment and the first embodiment, second and third embodiments is that the doped or epitaxial layer and/or the lead-out through hole are provided. The same parts as those of first, second or third embodiment will not be described in detail. The doped layer or epitaxial layer 160 may be used to form a part of function layers of the device, so as to form a required device in the subsequent process of manufacturing the device. The lead-out through hole is adapted to electrically lead out the conductive interconnect layer, that is, to lead out the conductive interconnect layer buried under the first substrate onto the upper surface of the first substrate. In this way, it is easy to provide the subsequent electrical connection of the device, thus simplifying the subsequent manufacturing process and saving area of the integrated device.

Compared the manufacturing method of the fourth embodiment with that of the first, second or third embodiment, the difference is described as followings.

The step of preparing a first substrate includes: preparing the first substrate 100, where an epitaxial layer or doped layer 160 is formed on a first surface 100-1 of the first substrate, which is adapted to form a part of function layers of the device.

Alternatively, the step of preparing a first substrate further includes: forming a lead-out through hole 170 with an insulation layer inside the first substrate 100 from the first surface 100-1, a doped layer or epitaxial layer 160. After coupling the second substrate 200, the method further includes: thinning and polishing the first substrate 100 from a surface 100-2 opposite to the first surface to expose the lead-out through hole 170, so that the lead-out through hole 170 passes through the first substrate 100, and the lead-out through hole 170 is adapted to electrically lead out the conductive interconnect layer 110.

Compared with the above mentioned manufacturing methods, the difference comprises to further form a doped layer or epitaxial layer 160 and/or a lead-out through hole in the substrate structure. The same parts as those of first, second or third embodiment will not be described in detail. The doped layer or epitaxial layer 160 may be used to form a part of function layers of the device, so as to form a required device during the subsequent process of manufacturing the device. The lead-out through hole 170 is adapted to electrically lead out the conductive interconnect layer 11. In this way, it is easy to provide the further electrical connection for the conductive interconnect layer 110 and lead the conductive interconnect layer toward a wire bonding pad for packaging, or other functions.

The above described are only preferable embodiments of the invention, and will not limit the invention in any form. Based on the substrate structure provided by the invention, the stress is avoided in a substrate for forming a device. According to a particular design requirement, a device, a circuit or other structures may be further manufactured, especially MEMS, a power device and a circuit.

Preferred embodiments of the present invention are disclosed above, which should not be interpreted as limiting the present invention. Numerous alternations, modifications, and equivalents can be made to the technical solution of the present invention by those skilled in the art in light of the methods and technical content disclosed herein without deviation from the scope of the present invention. Therefore, any alternations, modifications, and equivalents made to the embodiments above according to the technical essential of the present invention without deviation from the scope of the present invention should fall within the scope of protection of the present invention.

The invention claimed is:

1. A method for manufacturing a semiconductor substrate structure, comprising:
   preparing a first substrate;
   forming at least one conductive layer and a bonding layer on a first surface of the first substrate in sequence;
   etching the bonding layer and the at least one conductive layer, so as to form a second opening to expose the first surface;
   preparing a second substrate;
   forming a first opening in a second substrate from a second surface of the second substrate;
   oppositely arrange the first substrate and the second substrate, wherein the first surface of the first substrate faces toward a second surface of the second substrate; and
   coupling the first substrate and the at least one conductive layer to the second surface of the second substrate via the bonding layer, so as to fixedly coupled the first substrate and the at least one conductive layer to the second substrate,
   wherein a first cavity is formed by the first opening and a second cavity is formed by the second opening.

2. The manufacturing method according to claim 1, wherein after coupling the first substrate and the at least one conductive layer to the second substrate, the manufacturing method further comprises: thinning and polishing the first substrate from a surface opposite to the first surface.

3. The manufacturing method according to claim 1, wherein
   preparing the first substrate further comprises: forming a plurality of isolation regions in the first substrate from the first surface of the first substrate, wherein the isolation regions passes through the first substrate, and the first substrate is divided into regions mutually insulated by the plurality of isolation regions.

4. The manufacturing method according to claim 1, wherein
   the preparing a first substrate comprises: preparing the first substrate, wherein an epitaxial layer or doped layer is formed on the first surface of the first substrate, and the epitaxial layer or doped layer is adapted to form a part of the functional layers of a device.

5. The manufacturing method according to claim 1, wherein
   the preparing a first substrate further comprises: forming, in the first substrate, a lead-out through hole; and
   the lead-out through hole passes through the first substrate.

6. The manufacturing method according to claim 1, wherein the bonding layer is an insulating layer or a conductive layer.

7. The manufacturing method according to claim 1, wherein one of the at least one conductive layers performs a shielding function.

8. The manufacturing method according to claim 1, wherein at least two conductive layers are formed on the first surface of the first substrate.

* * * * *